United States Patent
Lian et al.

(10) Patent No.: US 6,734,057 B2
(45) Date of Patent: May 11, 2004

(54) METHOD OF PATTERNING CAPACITORS AND CAPACITORS MADE THEREBY

(75) Inventors: Jenny Lian, Tokyo-to (JP); Haoren Zhuang, Tokyo-to (JP); Ulrich Egger, Yokohama (JP); Karl Hornik, Kamakuru (JP)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/260,229

(22) Filed: Sep. 27, 2002

(65) Prior Publication Data

US 2004/0063278 A1 Apr. 1, 2004

(51) Int. Cl.[7] .......................................... H01L 21/8242
(52) U.S. Cl. ............................................ 438/240
(58) Field of Search ................ 438/3, 240, 778, 438/253

(56) References Cited

U.S. PATENT DOCUMENTS 5,070,026 A * 12/1991 Greenwald et al. ............ 437/3
5,759,265 A * 6/1998 Nashimoto et al. ......... 117/105
5,889,299 A * 3/1999 Abe et al. .................... 257/295

* cited by examiner

Primary Examiner—Hoai Ho
Assistant Examiner—Quoc Hoang
(74) Attorney, Agent, or Firm—Fish & Richardson, P.C.

(57) ABSTRACT

A method of forming a ferroelectric capacitor, in particular for use in a FeRAM or high-k DRAM application, and a capacitor made by the method. The method comprises forming a first layer which is patterned, for example by a reactive ion etching method. A ferroelectric material is then formed over the patterned first layer. The morphology of the ferroelectric material will be dependent upon the patterning of the first layer. The ferroeletric layer is then patterned, for example using a wet etching or a reactive ion etching method. The etching will depend upon the morphology of the ferroelectric layer. After etching the ferroelectric layer, a conductive layer is provided over the ferroelectric layer to form a first electrode of the capacitor. If the first layer is a conductive layer, this forms the second electrode. If the first layer is a non-conductive layer, the conductive layer is patterned to form both the first and second electrodes.

32 Claims, 2 Drawing Sheets

METHOD OF PATTERNING CAPACITORS AND CAPACITORS MADE THEREBY

The present invention relates to a method of patterning capacitors, especially for ferroelectric applications including non-volatile memories known as FeRAM and for high-k dynamic random access memory (DRAM).

Ferroelectric capacitors have the advantage that they are able to switch quickly and can be fabricated on a single VLSI chip.

FeRAM's are advantageous in that they have the endurance of DRAM, the fast read/write times of SRAM and the non-volatility of flash.

Conventionally, an FeRAM is manufactured by depositing a ferroelectric film, such as lead zirconate titanate (PZT) or strontium ruthenium oxide (SRO) on a first, planar, electrode film, and forming a second electrode film over the ferroelectric layer. The second electrode layer and the ferroelectric film are then etched using a reactive ion etch method, after which the first electrode film is etched using a similar method. The result is a number of stacks comprising a first and second electrode film sandwiching the ferroelectric film.

Such a manufacturing method has various disadvantages. Firstly, due to the low etch rate of the ferroelectric film, the devices are slow to manufacture and this results in a low productivity. Secondly, as a result of the poor selectivity of the etch mask, the etching has a low taper angle. This reduces the density of capacitors that may be formed on the device, and therefore limits the capacity of a memory formed using the technique.

According to a first aspect of the present invention, a method of forming a capacitor includes the steps of:

providing a first layer, patterning the first layer:

forming a second layer on the first layer, the second layer being formed of a ferroelectric material, the ferroelectric material having a morphology dependent upon the underlying first layer;

patterning the second layer; and, forming a conductive layer over the resulting structure.

With the method according to the present invention, the patterning of the second, ferroelectric layer, will be dependent upon the morphology of the layer, which is in turn dependent upon the patterning of the underlying, first layer. Therefore, by patterning the first layer prior to forming the ferroelectric layer, the patterning of the ferroelectric layer may advantageously be affected. In particular, where the ferroelectric layer is formed over a portion where the first layer remains, the ferroelectric layer may have a crystalline morphology, however where the ferroelectric layer is deposited over a portion where the first layer has been removed, the ferroelectric layer may have an amorphous morphology. Since the patterning of the ferroelectric layer is dependent upon the morphology of the ferroelectric layer, the patterning will be different in different regions dependent upon the patterning of the underlying layer.

The patterning of the first layer may be carried out by a reactive Ion etching (RIE) method. Such a method for etching electrically conductive and electrically insulating materials is well known.

The patterning of the ferroelectric layer is preferably carried out by a reactive ion etch or a wet etching method. For both methods, the rate of etching of ferroelectric material is much greater for amorphous material than for crystalline material. For example, for PZT, the etch rate for amorphous PZT by a reactive ion etching method is about four times that for crystalline PZT, and for etching using a wet etching method, the etch rate for amorphous PZT is about nine times that for amorphous PZT. Therefore, by patterning the underlying first layer, to selectively control the morphology of the ferroelectric layer, the time required for etching of the ferroelectric layer may be reduced. A further advantage of the present invention is that the selective etching of a ferroelectric layer by selective reactive ion etching is that no mask is required. This is advantageous as it avoids the cost and time associated with producing such a mask. Furthermore, the etching is able to create a steeper taper angle than is possible with the use of a mask. This allows a greater density of capacitors to be formed.

In one embodiment, the first layer is formed of an electrically conductive material, such as Pt, Ir. $IrO_2$ or SRO. Where the first layer is formed of an electrically conductive material, this layer may form a first electrode with the conductive layer deposited over the ferroelectric layer forming a second electrode.

In an alternative embodiment, the first layer is formed of a generally non-electrically conductive material, such as $Al_2O_3$, SiN or $SiO_2$. In this case, it is preferred that the electrically conductive layer deposited over the ferroelectric layer functions as both electrodes.

According to a second aspect of the present Invention, there is provided a capacitor formed in accordance with the method of the first aspect of the present invention.

The present invention will now be described, by way of example, with reference to the accompanying drawings, in which.

Figure 1:
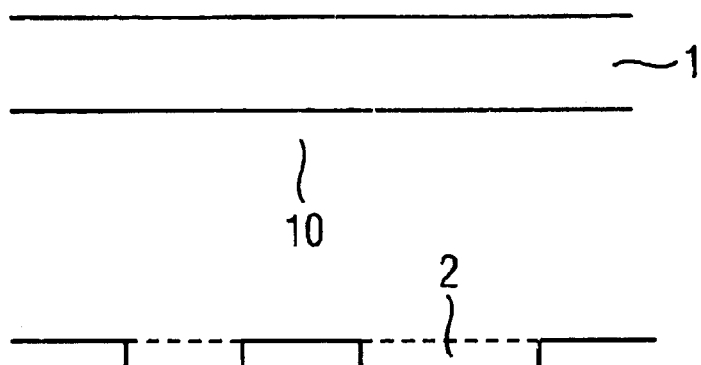
FIG. 1 shows the first step in the formation of a capacitor which is an embodiment of the invention.
Figure 2:
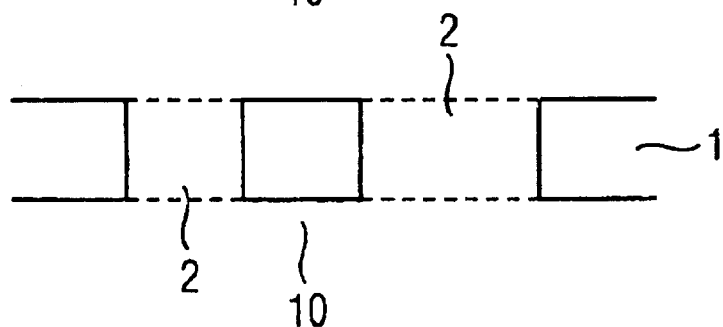
FIG. 2 shows the second step in the formation of a capacitor.

As shown in FIG. 1, a first layer 1 of Pt, Ir, $IrO_2$, SRO, $Al_2O_3$, SiN or $SiO_2$ is formed. The first layer is formed on a Si substrate 10 or a SiO2 layer on a Si substrate in case that CMOS devices are already formed underneath. The first layer may be formed from a metal (Pt. Ir and $IrO_2$) or an oxide (SRO, $Al_2O_3$) target by sputtering deposition or by CVD (SiN and $SiO_2$). The thickness of the first layer is from a few tens to a few hundreds of nanometers As shown in FIG. 2, the first layer 1 is etched using a reactive ion etching method to selectively remove portions 2 of the first layer 1. Portions 2 are removed from areas where it is desired not to form capacitors in the final device.

Figure 3:
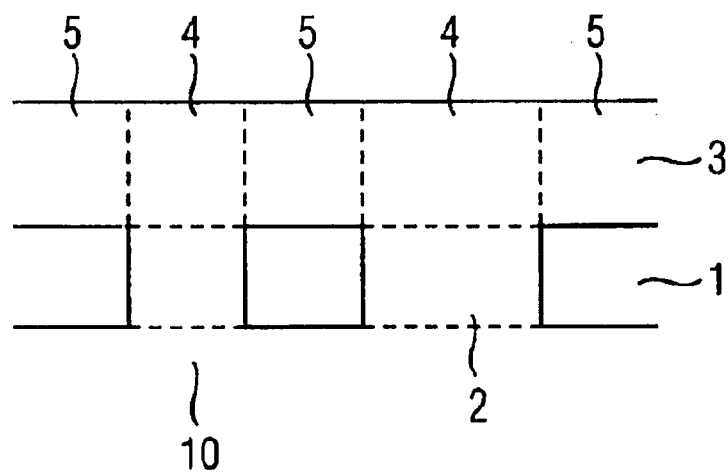
FIG. 3 shows the third step in the formation of a capacitor.

As shown in FIG. 3, a layer of a ferroelectric material 3 such as lead zirconate titanate (PZT) or strontium ruthenium oxide (SRO) is deposited over the etched first layer 1 by MOCVD with a thickness of 100 to 1000 μm. In regions 5 in which the ferroelectric material 3 overlies portions of the first layer 1, the ferroelectric material 3 will have a crystalline structure. In regions 4 where the ferroelectric material 3 overlies portions 2 where the first layer 1 has been removed, the ferroelectric material 3 will have an amorphous structure.

Figure 4:
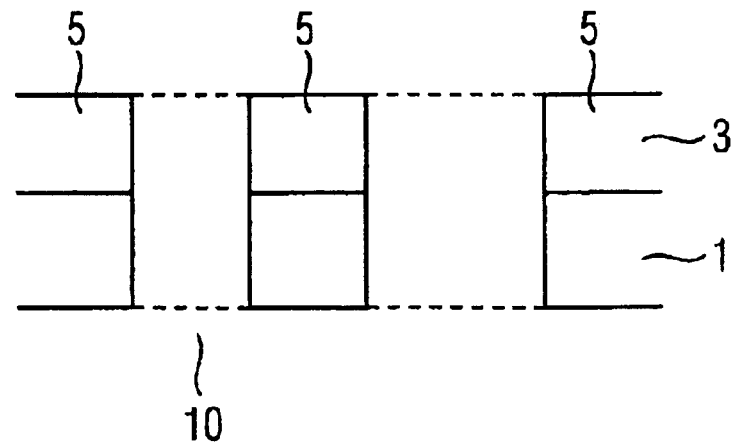
FIG. 4 shows the fourth step in the formation of a capacitor.

As shown in FIG. 4, the layer of a ferroelectric material 3 is selectively etched, for example using a wet etching or a reactive ion etching method. In the areas where the ferroelectric material has an amorphous structure, the etching can work more rapidly than where the ferroelectric material has a crystalline structure, and therefore the amorphous material may be etched rapidly. If desired, the crystalline material may also be etched. This etching can use a mask, although where reactive ion etching is used, this does not require a mask.

Figure 5:
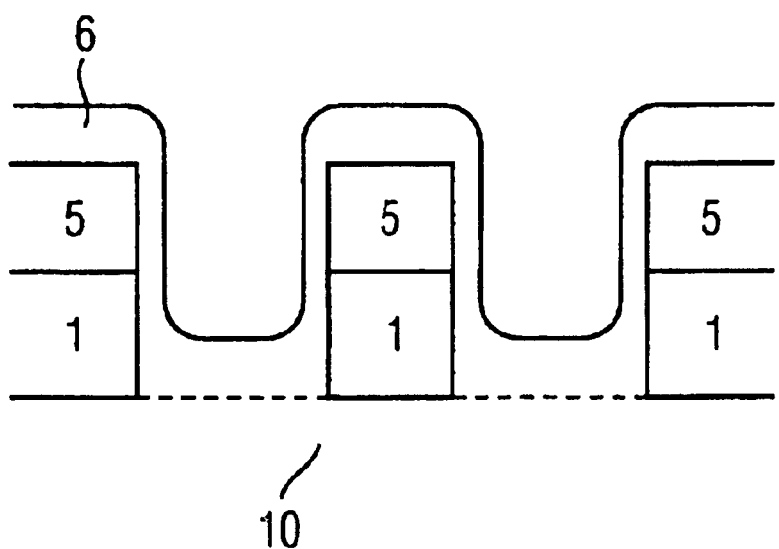
FIG. 5 shows the fifth step in the formation of a capacitor.
Figure 6:
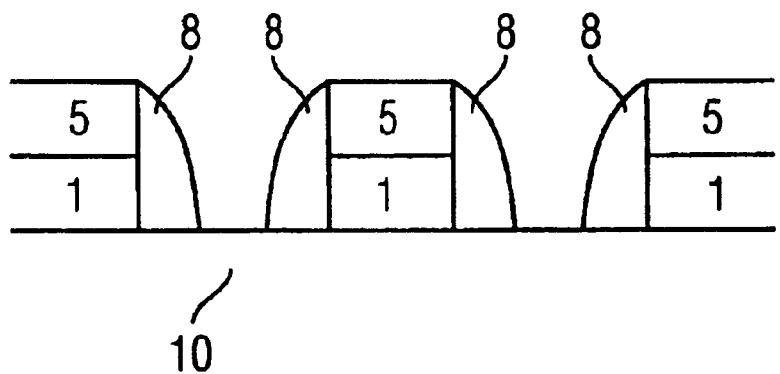
FIG. 6 shows a capacitor made in accordance with the method of the present invention.
Figure 7:
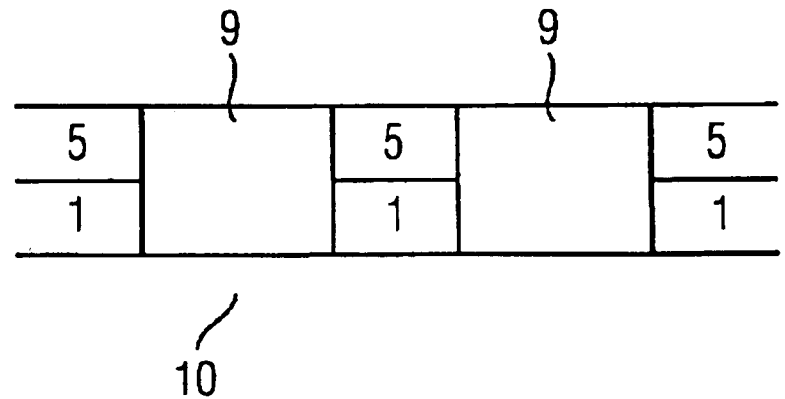
FIG. 7 shows a capacitor made in accordance with the method of the present invention wherein Chemical Mechanical Planarization has been used to move a layer above the ferroelectic layer.

As shown in FIG. 5, after patterning the ferroelectric layer 3, a conductive layer 6 is deposited over the ferroelectric layer 3. This layer is made from a metal target by sputtering deposition or from a chemical solution by electrode planting. The thickness is from 50 nm to 100 nm. The bottom part of the conductive layer 6 adjacent the first layer 1 may be removed (e.g. in the case that it is conductive) by a suitable method, such as reactive ion etching (RIE).

Where the first layer 1 is conductive, the first layer 1 and the conductive layer 6 act as electrodes for the device. If the first layer 1 is formed of a non-conductive material, the conductive layer 6 is formed so as to be able to function as both electrodes. This is done by removing the portion of layer 6 above the remaining portions 5 of the patterned ferroelectric layer 3. As shown in FIG. 6, using RIE to remove the horizontal portion of layer 6, results In spacers 8 on the sidewall of capacitor which form two electrodes. An alternative way of removing the portions of the layer 6 above the patterned ferroelectric layer 3 is by using CMP (Chemical Mechanical Planarization) to remove layer 6 above ferroelectric layer 3, then the remaining portions 9 of the layer 6 between two capacitors form electrodes for two adjacent capacitors, as shown in FIG. 7.

Note that there are several ways to obtain the effect that the presence of the first layer 1 causes the regions 5 to have a crystalline form. For most ferroelectric and high k dielectric materials, such as PZT and BST, the different morphologies are achieved without any additional treatment, and the crystalline films are formed where the surface of the first layer 1 has a matching crystal structure in terms of crystal cell unit size and atomic arrangement. For example, the crystal cell unit size in a <111> oriented Pt film is closer to the BST cell unit than that in a SiO2 film. Therefore, the BST film will be a crystalline on Pt but amorphous on SiO2.

What is claimed is:

1. A method of forming a capacitor includes the steps of:
   providing a first layer;
   patterning the first layer by removing portions of the first layer;
   forming a second layer on the first layer, the second layer being formed of a ferroelectric material, the ferroelectric material having a variation in morphology having a first pattern based on the pattern of the first layer;
   patterning the second layer by using the variation in morphology to more slowly etch portions of the second layer covering remaining portions of the patterned first layer and more rapidly etch portions of the second layer covering the removed portions of the first layer to create a second pattern based on the first pattern of the patterned first layer; and,
   forming a conductive layer to sandwich the second layer between the conductive layer and the first layer.

2. The method according to claim 1, wherein the first layer is a conductive layer.

3. The method according to claim 2, wherein the first layer is made from a material selected from the group consisting of Pt, Ir, $IrO_2$ and SRO.

4. The method according to claim 1, wherein the first layer is a non-conductive layer.

5. The method according to claim 4, wherein the first layer is made from a material selected from the group consisting of $Al_2O_3$, SiN and $SiO_2$.

6. The method according to claim 4 further comprising removing portions of the conductive layer overlying the patterned second layer.

7. The method of claim 6 in which the portions of the conductive layer ate removed by reactive ion etching.

8. The method of claim 6 in which the portions of the conductive layer are removed by chemical mechanical planarization.

9. The method according to claim 1, wherein ferroelectric layer is formed with a crystalline structure in those portions where the first layer remains.

10. The method according to claim 1, wherein ferroelectric layer is formed with an amorphous structure in those portions where the first layer has been removed.

11. The method according to claim 1, wherein the ferroelectric layer is patterned using an etching method.

12. The method according to claim 11, wherein the ferroelectric layer is patterned using a wet etching method.

13. The method according to claim 11, wherein the ferroelectric layer is patterned using a reactive ion etching method.

14. The method according to claim 1, wherein the first layer is patterned using an etching method.

15. The method according to claim 14, wherein the first layer is patterned using a wet etching method.

16. The method according to claim 14, wherein the first layer is patterned using a reactive ion etching method.

17. A capacitor formed by:
   providing a first layers;
   patterning the first layer;
   forming a second layer on the first layer, the second layer being formed of a ferroelectric material, the ferroelectric material having a variation in morphology having a first pattern based on the pattern of the first layer;
   patterning the second layer by using the variation in morphology to more slowly etch portions of the second layer covering remaining portions of the patterned first layer and more rapidly etch portion of the second layer covering the removed portions of the first layer to create a second pattern based on the first pattern of the patterned first layer; and,
   forming a conductive layer to sandwich the second layer between the conductive layer and the first layer.

18. The capacitor of claim 17, wherein the first layer is a conductive layer.

19. The capacitor of claim 18, wherein the first layer is made from a material selected from the group consisting of Pt, Ir, $IrO_2$ and SRO.

20. The capacitor of claim 17, wherein the first layer is a non-conductive layer.

21. The capacitor of claim 20, wherein the first layer is made from a material selected from the group consisting of $Al_2O_3$, SiN and $SiO_2$.

22. The capacitor of claim 20 further comprising removing portions of the conductive layer overlying the patterned second layer.

23. The capacitor of claim 22 in which the portions of the conductive layer are removed by reactive ion etching.

24. The capacitor of claim 22 in which the portions of the conductive layer are removed by chemical mechanical planarization.

25. The capacitor of claim 17, wherein ferroelectric layer is formed with a crystalline structure in those portions where the first layer remains.

26. The capacitor of claim 17, wherein ferroelectric layer is formed with an amorphous structure in those portions where the first layer has been removed.

27. The capacitor of claim 17, wherein the ferroelectric layer is patterned using an etching method.

28. The capacitor of claim 27, wherein the ferroelectric layer is patterned using a wet etching method.

29. The capacitor of claim 27, wherein the ferroelectric layer is patterned using a reactive ion etching method.

30. The capacitor of claim 17, wherein the first layer is patterned using an etching method.

31. The capacitor of claim 30, wherein the first layer is patterned using a wet etching method.

32. The capacitor of claim 30, wherein the first layer is patterned using a reactive ion etching method.

\* \* \* \* \*